United States Patent
Chung et al.

(10) Patent No.: US 9,196,423 B2
(45) Date of Patent: Nov. 24, 2015

(54) MULTILAYER CERAMIC ELECTRONIC PART AND METHOD OF MANUFACTURING THE SAME

(71) Applicant: SAMSUNG ELECTRO-MECHANICS CO., LTD., Gyunggi-do (KR)

(72) Inventors: Hae Suk Chung, Gyunggi-do (KR); Min Cheol Park, Gyunggi-do (KR); Hyung Joon Kim, Gyunggi-do (KR); Byoung Hwa Lee, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 258 days.

(21) Appl. No.: 13/670,002

(22) Filed: Nov. 6, 2012

(65) Prior Publication Data

US 2013/0314843 A1 Nov. 28, 2013

(30) Foreign Application Priority Data

Nov. 14, 2011 (KR) ........................ 10-2011-0118192

(51) Int. Cl.
| | |
|---|---|
| H01G 4/232 | (2006.01) |
| H01L 41/047 | (2006.01) |
| H01L 41/293 | (2013.01) |
| H01G 4/30 | (2006.01) |
| H01C 1/148 | (2006.01) |
| H01F 17/00 | (2006.01) |
| H01G 4/012 | (2006.01) |

(52) U.S. Cl.
CPC ............ *H01G 4/232* (2013.01); *H01L 41/0472* (2013.01); *H01L 41/293* (2013.01); *H01C 1/148* (2013.01); *H01F 17/0013* (2013.01); *H01G 4/012* (2013.01); *H01G 4/30* (2013.01)

(58) Field of Classification Search
None
See application file for complete search history.

(56) References Cited

U.S. PATENT DOCUMENTS

| | | | |
|---|---|---|---|
| 2008/0186652 A1* | 8/2008 | Lee et al. .................... | 361/306.3 |
| 2008/0204969 A1* | 8/2008 | Takashima et al. ......... | 361/301.4 |
| 2009/0015986 A1* | 1/2009 | Togashi ...................... | 361/321.4 |
| 2009/0244803 A1* | 10/2009 | Lee et al. ..................... | 361/301.4 |

FOREIGN PATENT DOCUMENTS

JP 2004-095680 A 3/2004

* cited by examiner

*Primary Examiner* — Dion R Ferguson
(74) *Attorney, Agent, or Firm* — McDermott Will & Emery LLP

(57) ABSTRACT

There is provided a multilayer ceramic electronic part, including: a ceramic element having a plurality of dielectric layers laminated therein; a plurality of first and second internal electrodes each formed on at least one surface of each of the plurality of dielectric layers within the ceramic element, the first and second internal electrodes respectively including first and second lead parts extended therefrom to be exposed through one surface of the ceramic element; and first and second external electrodes formed on one surface of the ceramic element, and electrically connected to the first and second internal electrodes through exposed portions of the first and second lead parts, respectively, wherein a ratio of a width of the first or second lead part to a width of the first or second external electrode is 10 to 85%.

10 Claims, 2 Drawing Sheets

MULTILAYER CERAMIC ELECTRONIC PART AND METHOD OF MANUFACTURING THE SAME

CROSS-REFERENCE TO RELATED APPLICATIONS

This application claims the priority of Korean Patent Application No. 10-2011-0118192 filed on Nov. 14, 2011 in the Korean Intellectual Property Office, the disclosure of which is incorporated herein by reference.

BACKGROUND OF THE INVENTION

1. Field of the Invention

The present invention relates to a multilayer ceramic electronic part and a method of manufacturing the same.

2. Description of the Related Art

As representative electronic parts using a ceramic material, there are provided a capacitor, an inductor, a piezoelectric element, a varistor, or a thermistor.

Among these ceramic electronic parts, multi-layer ceramic capacitors (MLCCs) have a small size, secure high capacitance, and have ease of mountability.

Multilayer ceramic capacitors are chip type condensers performing a main function of being charged with or discharging electricity while being mounted on a circuit board of various electronic products, such as a computer, a personal digital assistant (PDA), a cellular phone, or the like. Multilayer ceramic capacitors have several sizes and lamination types depending on intended usage and capacity thereof.

In particular, as the trend has been for electronic products to be smaller, ultra-miniaturization and the provision of ultra-high capacity to multi-layer ceramic capacitors have been also required.

For this reason, a multilayer ceramic capacitor in which dielectric layers and internal electrodes are thinned for the ultra-miniaturization of products and a large number of dielectric layers are laminated to provide ultra-high capacity therein has been manufactured.

As such, in order to satisfy conditions for ultra-miniaturization and ultra-high capacity of multilayer ceramic capacitors, it is important to prevent degradation of the insulation resistance (IR) and achieve low equivalent series inductance (ESL) characteristics.

The degradation of insulation resistance occurs when plating liquid permeates into the internal electrodes through the dielectric layers. In order to prevent this, a margin part having a predetermined size is prepared on the dielectric layer, around the internal electrode. Here, only a portion of the margin part is formed as a connection portion for electrically connecting the internal electrode to an external electrode.

Since the characteristics and reliability of the multilayer ceramic capacitor are influenced, depending on how the connection portion is designed, research in relation to these factors is continuously under way.

For example, when the connection portion is smaller than the external electrode, a degradation of insulation resistance may be prevented, but contact properties with the external electrode may be deteriorated, resulting in short circuits between electrical connections. When the connection portions are larger than the external electrodes, contact properties with regard to the external electrodes are improved; however, a plating liquid may still permeate thereinto.

SUMMARY OF THE INVENTION

An aspect of the present invention provides a multilayer ceramic electronic part, capable of preventing a permeation of a plating liquid thereinto, thereby preventing degradation of insulation resistance (IR) and allowing for low ESL characteristics.

According to an aspect of the present invention, there is provided a multilayer ceramic electronic part, including: a ceramic element having a plurality of dielectric layers laminated therein; a plurality of first and second internal electrodes each formed on at least one surface of each of the plurality of dielectric layers within the ceramic element, the first and second internal electrodes respectively including first and second lead parts extended therefrom to be exposed through one surface of the ceramic element; first and second external electrodes formed on one surface of the ceramic element, and electrically connected to the first and second internal electrodes through exposed portions of the first and second lead parts, respectively, wherein a ratio of a width of the first or second lead part to a width of the first or second external electrode is 10 to 85%.

The first and second lead parts may have a length of 30 to 100 μm.

The first and second internal electrodes may have a thickness of 0.2 to 1.0 μm.

The first and second lead parts may have a thickness of 0.2 to 1.0 μm.

The first and second lead parts may be disposed alternately with each other along a lengthwise side of each of the first and second internal electrodes.

The first and second lead parts may have the same width.

The first and second lead parts may have different widths.

The first and second lead parts may be positioned in the middle sections of the first and second external electrodes, respectively.

The first and second internal electrodes may be laminated in a direction perpendicular with respect to a direction in which the first and second external electrodes are formed.

The first and second external electrodes may be formed to have the same height as the ceramic element.

The first and second external electrodes may be spaced apart from the one surface of the ceramic element.

According to another aspect of the present invention, there is provided a method of manufacturing a multilayer ceramic electronic part, including: forming first and second internal electrode layers on at least one surface of each of first and second ceramic sheets, respectively, to allow margin parts to be defined by the respective first and second internal electrode layers; forming first and second lead layers on portions of the margin parts of the first and second ceramic sheets, respectively, so as to allow each of the first and second internal electrode layers to be connected to one surface of each of the first and second ceramic sheets; laminating a plurality of the first and second ceramic sheets having the respective first and second internal electrode layers and the respective first and second lead layers, alternately with each other to form a laminate; firing the laminate; and forming first and second external electrodes so as to cover a surface of the laminate exposing the first and second lead layers therethrough, wherein a ratio of a width of the first or second lead layer to a width of the first or second external electrode is 10 to 85%.

The respective margin parts of the first and second ceramic sheets may be controlled, to allow the first and second lead layers to have a length of 30 to 100 μm.

The first and second lead layers may be formed alternately with each other along a lengthwise side of the first or second internal electrode layer on the first and second ceramic sheets, respectively.

The first and second lead layers may have the same width, or different widths with regard to each other.

The first and second lead layers may be positioned in the middle sections of the first and second external electrodes, respectively.

In the laminate, the first and second ceramic sheets may be laminated to allow the respective first and second internal electrode layers to be disposed in a direction perpendicular to a direction in which the first and second external electrodes are formed.

The first and second external electrodes may be formed to have the same height as the laminate.

The first and second external electrodes may be spaced apart from a surface of the laminate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
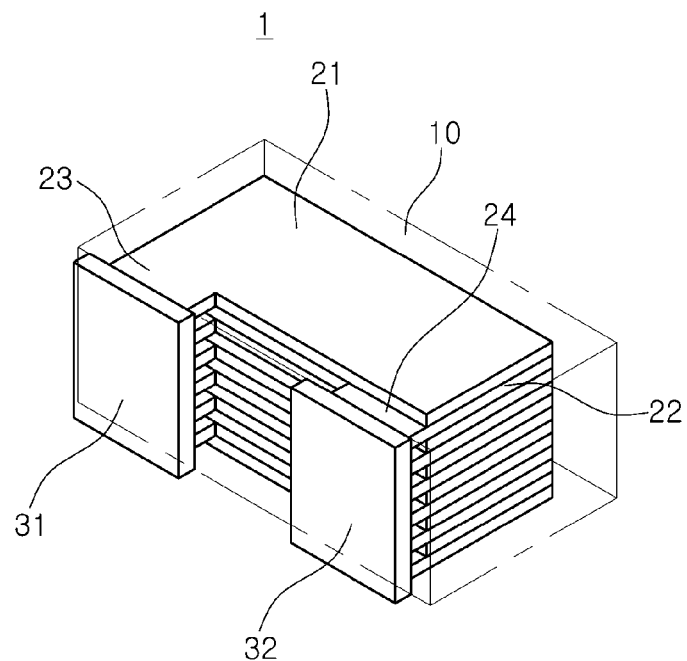
FIG. 1 is a perspective view showing a schematic structure of a multilayer ceramic capacitor according to an embodiment of the present invention.

Hereinafter, embodiments of the present invention will be described in detail with reference to the accompanying drawings.

However, the invention may be embodied in many different forms and should not be construed as being limited to the embodiments set forth herein.

The embodiments of the present invention are provided so that those skilled in the art may more completely understand the present invention.

In the drawings, the shapes and dimensions may be exaggerated for clarity, and the same reference numerals will be used throughout to designate the same or like components.

In addition, like reference numerals denote parts performing similar functions and actions throughout the drawings.

In addition, unless explicitly described otherwise, "comprising" any components will be understood to imply the inclusion of other components but not the exclusion of any other components.

The present disclosure is directed to a ceramic electronic part, and the ceramic electronic part according to an embodiment of the present invention may be a multilayer ceramic capacitor, an inductor, a piezoelectric element, a varistor, a chip resistor, a thermistor, or the like. The multilayer ceramic capacitor will be described as one example of the ceramic electronic part as follows.

In addition, in the present embodiment, for the sake of convenient explanation, a forward direction is defined by a direction in which external electrodes are formed in a ceramic element, and a left/right direction is defined by a direction that follows a lengthwise side of an internal electrode.

The multilayer ceramic capacitor of the present embodiment may be a 2-terminal vertically laminated or vertical multilayer capacitor, and the present invention is not limited thereto.

The "2-terminal" indicates that two terminals provided as terminals of the capacitor are connected to a circuit board. The "vertically laminated or vertical multilayer" indicates that internal electrodes laminated in the capacitor are disposed vertically to a mounting region surface of the circuit board.

Figure 2:
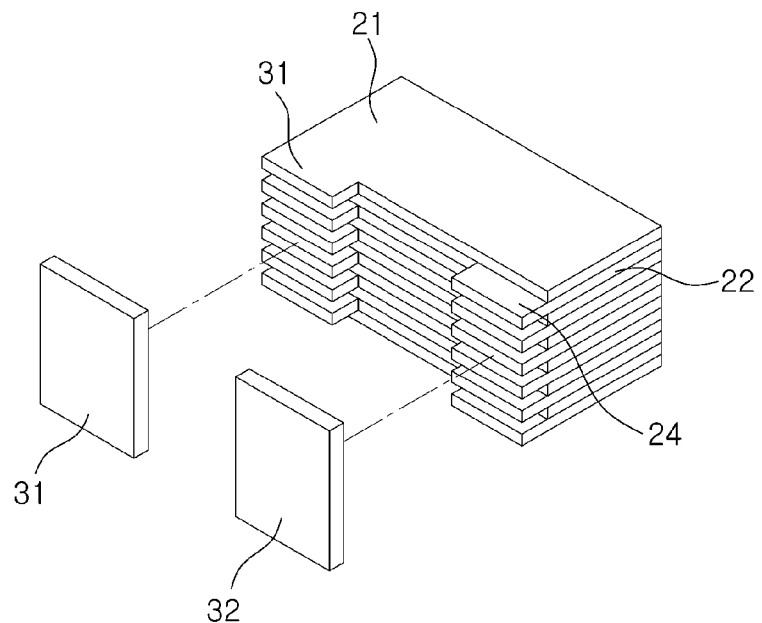
FIG. 2 is an exploded perspective view of FIG. 1.
Figure 3:
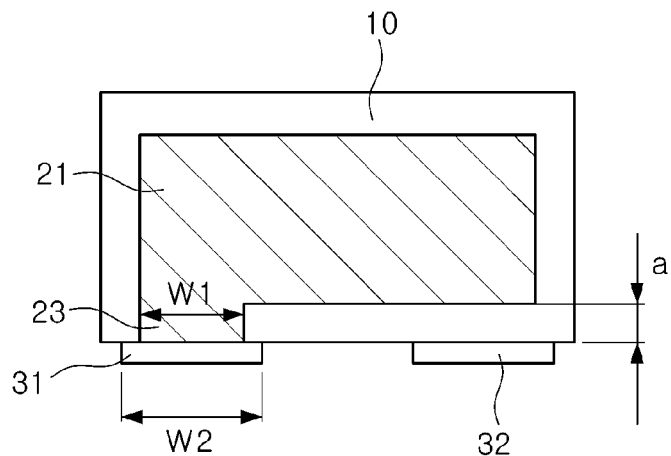
FIG. 3 is a cross-sectional view showing a coupling structure of a first internal electrode and a first external electrode.
Figure 4:
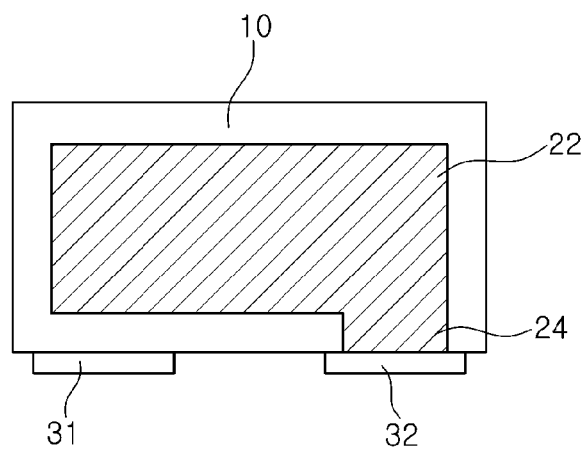
FIG. 4 is a cross-sectional view showing a coupling structure of a second internal electrode and a second external electrode, of FIG. 1.
Figure 5:
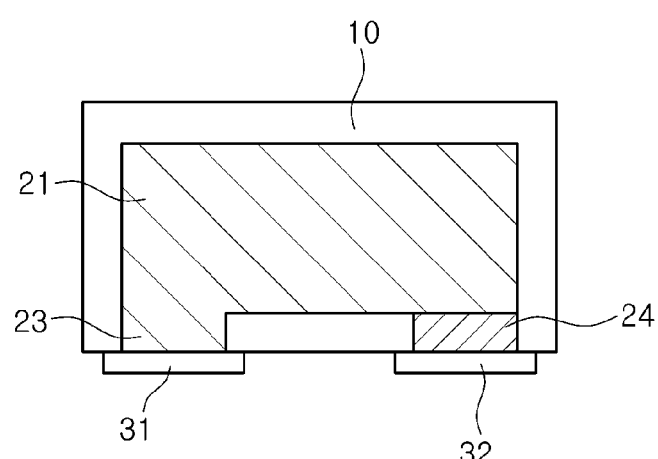
FIG. 5 is a cross-sectional view showing a coupling structure of the first and second internal electrodes and the first and second external electrodes of FIG. 1.

Referring to FIGS. 1 through 5, a multilayer ceramic capacitor 1 according to the present embodiment may include a ceramic element 10 having a plurality of dielectric layers laminated therein, and a plurality of first and second internal electrodes 21 and 22 each formed on at least one surface of each of the plurality of dielectric layers within the ceramic element. The first and second internal electrodes 21 and 22 may include first and second lead parts, respectively, which are extended therefrom to be exposed through a side surface in a forward direction of the ceramic element 10.

In addition, first and second external electrodes 31 and 32 may be formed on the side surface in a forward direction of the ceramic element 10 such that they are contacted with exposed portions of the first and second lead parts 23 and 24 and thus they are electrically connected to the first and second internal electrodes 21 and 22.

Here, a ratio of a width (W1) of the first or second lead part 23 or 24 to a width (W2) of the first or second external electrode 31 or 32 may be set to 10 to 85%.

These numerical values will be described in more detail by specifically comparing examples and comparative examples, as follows.

The ceramic element 10 may be formed by laminating a plurality of dielectric layers. Here, the plurality of dielectric layers constituting the ceramic element 10 may be sintered in one body so that a boundary between neighboring dielectric layers cannot be confirmed.

Also, the ceramic element 10 is not particularly limited in view of a shape thereof, but may generally have a rectangular parallelepiped shape.

In addition, the ceramic element 10 is not particularly limited in view of a dimension thereof, but for example, the ceramic element 10 may be formed in a size of 0.6 mm×0.3 mm or the like to constitute a multilayer ceramic capacitor 1 having a high capacitance of 1.0 μF or higher.

In addition, as necessary, a dielectric cover layer (not shown) with a predetermined thickness may be formed on the outermost surface of the ceramic element 10, that is, on upper and lower surfaces of the ceramic element, in the drawings.

The dielectric layer constituting this ceramic element 10 may include a ceramic powder, for example, a $BaTiO_3$ based ceramic powder.

The $BaTiO_3$-based ceramic powder may be $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like is partially solidified in $BaTiO_3$, but is not limited thereto.

The ceramic powder may have an average particle size of 0.8 μm or less, and in detail, of 0.05 to 0.5 μm, but is not limited thereto.

As necessary, the dielectric layer may further include at least one of transition metal oxides or carbides, rare earth elements, Mg, and Al, together with the ceramic powder.

In addition, a thickness of the dielectric layer may be arbitrarily changed depending on capacity design of the multilayer ceramic capacitor 1.

In the present embodiment, the dielectric layer may have a thickness of 1.0 μm or less, and in detail, 0.01 to 1.0 μm, but the present invention is not limited thereto.

The first and second internal electrodes 21 and 22 may be formed of a conductive paste including a conductive metal.

Here, the conductive metal may be Ni, Cu, Pd or an alloy thereof, and the present invention is not limited thereto.

As such, the conductive paste may be printed on the ceramic green sheets for dielectric layers by a printing method, such as screen printing or gravure printing, to form the internal electrodes 21 and 22 on the ceramic green sheets, respectively. Then, the ceramic green sheets on which the internal electrode layers have been printed are laminated alternately with each other, and followed by firing, thereby forming the ceramic element 10.

Therefore, a capacitance may be formed in a region in which the first and second internal electrodes 21 and 22 overlap each other.

In addition, the thickness of the first and second internal electrodes 21 and 22 may be determined depending on usage thereof, and for example, may be determined within a range of 0.2 to 1.0 μm in consideration of the size of the ceramic element 10. However, the present invention is not limited thereto.

When the first and second internal electrodes 21 and 22 are formed on the dielectric layers, predetermined margin parts may be left on a portion of the dielectric layers excluding the first and second internal electrodes 21 and 22 therefrom, respectively, in order to prevent moisture or a plating liquid from permeating into the laminate and prevent electric short circuits.

Therefore, the first and second lead parts 23 and 24 may be formed on the margin parts of the dielectric layers respectively, such that they are extended from one surfaces of the first and second internal electrodes 21 and 22 in a forward direction, respectively, in order that the first and second internal electrodes 21 and 22 are electrically connected to the first and second external electrodes 31 and 32, respectively, the first and second external electrodes being formed on the side surface of the ceramic element and having different polarities.

Here, ends of the first and second lead parts 23 and 24 may be exposed through the side surface in a forward direction of the ceramic element 10.

The first and second lead parts 23 and 24 should not overlap each other in order to be respectively connected to only the first and second external electrodes having different polarities.

Therefore, the first and second lead parts 23 and 24, on the long side of the body parts 21 and 22, may be disposed alternately with each other in a stacking direction of the first and second internal electrodes 21 and 22 to the left and to the right.

Here, widths of the first and second lead parts 23 and 24 may be the same as each other, but the present invention is not limited thereto. As necessary, lengths of the first and second lead parts 23 and 24 may be different from each other.

Also, the first and second lead parts 23 and 24 may have a length of 30 to 100 μm.

When the length of each of the first and second lead parts 23 and 24 is below 30 μm, IR may be degraded or delamination may occur due to permeation of a plating liquid. When the length of each of the first and second lead parts 23 and 24 is above 100 μm, the ESL may extremely increase.

Here, delamination indicates that the dielectric layers laminated during a manufacturing procedure are delaminated from each other due to a step height between the margin part and a central portion of the ceramic element 10.

Since the lengths of the first and second lead parts 23 and 24 substantially correspond to the margin parts of the dielectric layers, the lengths of the first and second lead parts 23 and 24 may be controlled when the first and second internal electrodes 21 and 22 are formed.

In addition, the first and second lead parts 23 and 24 may be determined to have the same thickness as that of the first and second internal electrodes 21 and 22.

For example, in the present embodiment, since the first and second internal electrodes 21 and 22 each have a thickness of 0.2 to 1.0 μm, the thickness of each of the first and second lead parts 23 and 24 may be determined to be 0.2 to 1.0 μm, but the present invention is not limited thereto.

In the present embodiment, the first and second external electrodes 31 and 32 may be only formed on the side surface in a forward direction of the ceramic element 10.

Therefore, since a total mounting area in the present embodiment is relatively reduced as compared with other structures in which left and right external electrodes are formed, mounting density of the circuit board may be increased according to the present embodiment.

Here, more specifically, the first and second internal electrodes 21 and 22 may be laminated in a vertical direction with respect to a direction in which the first and second external electrodes 31 and 32 are formed, in order to increase the mounting density of the circuit board.

Meanwhile, the first and second external electrodes 31 and 32 may be formed to have a height corresponding to that of the ceramic element 10 so that they are stably connected to the plurality of first and second internal electrodes 21 and 22 laminated upwardly or downwardly.

However, the present invention is not limited thereto, and, as necessary, the first and second external electrodes 31 and 32 may be formed to be higher or lower than the ceramic element 10.

In addition, in order to optimize the preventing effect in permeation of a plating liquid, the first and second external electrodes 31 and 32 may be formed such that the first and second lead parts 23 and 24 are positioned in the middle sections of the first and second external electrodes 31 and 32 with respect to the left/right direction of the first or second internal electrode 21 or 22.

In addition, the first and second external electrodes 31 and 32 may be spaced apart from the surface of the ceramic element 1, but the present invention is not limited thereto.

Operations of the multilayer ceramic capacitor 1 of the present embodiment constituted as above will be described.

When the first and second internal electrodes 21 and 22 are formed on the dielectric layers, predetermined margin parts may be provided on portions of the dielectric layers excluding the first and second internal electrodes 21 and 22 therefrom, respectively.

These margin parts may serve to prevent moisture or the plating liquid from permeating into the first and second internal electrodes 21 and 22 after the respective dielectric layers are laminated to form the ceramic element 10, and may serve to prevent an electric short circuit by protecting the first and second internal electrodes from the external impact.

As described above, in the present embodiment, the first and second lead parts 23 and 24 may be provided on portions of the margin parts, respectively, so that the first and second internal electrodes 21 and 22 are electrically connected to the first and second external electrodes 31 and 32.

Here, the margin part may be formed to be relatively small in order to secure a relatively large capacitance of the first and second internal electrodes 21 and 22, but need to have a relatively minimum width in order to prevent the permeation of the plating liquid.

For this reason, the present applicant controlled a ratio between a width (W1) of the first or second lead part 23 or 24 and a width (W2) of the first or second external electrode 31 or 32 while a width of the margin part is fixed to a predetermined dimension, and resultantly, confirmed a range of the ratio at which permeation of the plating liquid can be prevented and a low ESL can be obtained.

When the ratio of the width (W1) of the first or second lead part 23 or 24 to the width (W2) of the first or second external electrode 31 or 32 is below 10%, the plating liquid may permeate into the first and second lead parts 23 and 24, which causes IR to be degraded.

When the ratio of the width (W1) of the first or second lead part 23 or 24 to the width (W2) of the first or second external electrode 31 or 32 is above 85%, the ESL may be reduced.

Therefore, a ratio of the width (W1) of the first or second lead part 23 or 24 to the width (W2) of the first or second external electrode 31 or 32 may be set to 10 to 85%.

Hereinafter, the present invention will be described in detail by exemplifying inventive examples and comparative examples therefor.

As described above, properties of laminated ceramic capacitors were measured as shown in Tables 1 through 3 while a width of the first or second lead part 23 or 24 was W1 and a width of the first or second external electrode 31 or 32 was W2.

Chips to be evaluated were manufactured by printing the first and second internal electrodes 21 and 22, the first and second lead parts 23 and 24, and the first and second external electrodes 31 and 32 with respect to molded sheets with a thickness of 2 μm, according to sizes thereof.

As shown in Table 1, a length (L) and a width (W) of the molded sheet were set to 0.4 mm and 0.2 mm, respectively, and a width (W2) of the first or second external electrode 31 or 32 was set to 0.170 mm. A width (W1) of the first or second lead part 23 or 24 was variously changed. Then, the number of chips in which the first or second lead part 23 or 24 was electrically disconnected from the first or second external electrode 31 or 32, or IR was degraded, was confirmed.

TABLE 1

| | w1 (mm) | W2 (mm) | L (mm) | W (mm) | w/W | # of diconnectivity | # of IR degradation [ea/100ea] |
|---|---|---|---|---|---|---|---|
| 1 | 0.010 | 0.170 | 0.4 | 0.2 | 5.9% | 15 | 0 |
| 2 | 0.016 | 0.170 | 0.4 | 0.2 | 9.4% | 4 | 0 |
| 3 | 0.018 | 0.170 | 0.4 | 0.2 | 10.6% | 0 | 0 |
| 4 | 0.020 | 0.170 | 0.4 | 0.2 | 11.8% | 0 | 0 |
| 5 | 0.050 | 0.170 | 0.4 | 0.2 | 29.4% | 0 | 0 |
| 6 | 0.060 | 0.170 | 0.4 | 0.2 | 35.3% | 0 | 0 |
| 7 | 0.070 | 0.170 | 0.4 | 0.2 | 41.2% | 0 | 0 |
| 8 | 0.080 | 0.170 | 0.4 | 0.2 | 47.1% | 0 | 0 |
| 9 | 0.090 | 0.170 | 0.4 | 0.2 | 52.9% | 0 | 0 |
| 10 | 0.100 | 0.170 | 0.4 | 0.2 | 58.8% | 0 | 0 |
| 11 | 0.110 | 0.170 | 0.4 | 0.2 | 64.7% | 0 | 0 |
| 12 | 0.120 | 0.170 | 0.4 | 0.2 | 70.6% | 0 | 0 |
| 13 | 0.140 | 0.170 | 0.4 | 0.2 | 82.4% | 0 | 0 |
| 14 | 0.143 | 0.170 | 0.4 | 0.2 | 83.8% | 0 | 0 |
| 15 | 0.145 | 0.170 | 0.4 | 0.2 | 85.3% | 0 | 3 |
| 16 | 0.147 | 0.170 | 0.4 | 0.2 | 86.5% | 0 | 8 |

<Comparison on Connectivity and IR Degradation Among Multilayer Ceramic Capacitors, According to the Ratio of Width of Lead Part to Width of External Electrode>

Referring to Table 1, in Samples 1 and 2, which were comparative examples, a ratio of the width of the lead part to the width of the external electrode was below 10%.

In these cases, many defective products having disconnection between the lead part and the external electrode due to a relatively very small exposed area of the lead part were found, and thus, it could be seen that there was reliability degradation thereof.

In addition, in Samples 15 and 16, which were comparative examples, a ratio of the width of the lead part to the width of the external electrode was above 85%.

In these cases, there were no defects in relation to connection between the external electrode and the lead part, but many defective products having IR degradation were found, and thus, it could be seen that there was reliability degradation thereof due to partial permeation of the plating liquid into the product.

TABLE 2

| | w1 (mm) | W2 (mm) | L (mm) | W (mm) | w/W | # of diconnectivity | # of IR degradation [ea/100ea] |
|---|---|---|---|---|---|---|---|
| 1 | 0.021 | 0.285 | 0.6 | 0.3 | 7.4% | 13 | 0 |
| 2 | 0.027 | 0.285 | 0.6 | 0.3 | 9.5% | 3 | 0 |
| 3 | 0.032 | 0.285 | 0.6 | 0.3 | 11.2% | 0 | 0 |
| 4 | 0.033 | 0.285 | 0.6 | 0.3 | 11.6% | 0 | 0 |
| 5 | 0.070 | 0.285 | 0.6 | 0.3 | 24.6% | 0 | 0 |
| 6 | 0.090 | 0.285 | 0.6 | 0.3 | 31.6% | 0 | 0 |
| 7 | 0.110 | 0.285 | 0.6 | 0.3 | 38.6% | 0 | 0 |
| 8 | 0.130 | 0.285 | 0.6 | 0.3 | 45.6% | 0 | 0 |
| 9 | 0.150 | 0.285 | 0.6 | 0.3 | 52.6% | 0 | 0 |
| 10 | 0.170 | 0.285 | 0.6 | 0.3 | 59.6% | 0 | 0 |
| 11 | 0.235 | 0.285 | 0.6 | 0.3 | 82.5% | 0 | 0 |
| 12 | 0.240 | 0.285 | 0.6 | 0.3 | 84.2% | 0 | 0 |
| 13 | 0.245 | 0.285 | 0.6 | 0.3 | 86.0% | 0 | 4 |
| 14 | 0.250 | 0.285 | 0.6 | 0.3 | 87.7% | 0 | 9 |

<Comparison on Connectivity and IR Degradation Among Multilayer Ceramic Capacitors, According to the Ratio of Width of Lead Part to Width of External Electrode>

As shown in Table 2, a length (L) and a width (W) of the molded sheet were set to 0.6 mm and 0.3 mm respectively, and a width (W2) of the first or second external electrode 31 or 32 was set to 0.285 mm. A width (W1) of the first or second lead part 23 or 24 was variously changed. Then, the number of chips in which the first or second lead part 23 or 24 was electrically disconnected from the first or second external electrode 31 or 32, or IR was degraded, was confirmed.

Referring to Table 2, in Samples 1 and 2, which were comparative examples, a ratio of the width of the lead part to the width of the external electrode was below 10%.

In these cases, many defective products having disconnection between the lead part and the external electrode due to a relatively very small exposed area of the lead part were found, and thus, it could be seen that there was reliability degradation thereof.

In addition, in Samples 13 and 14, which were comparative examples, a ratio of the width of the lead part to the width of the external electrode was above 85%.

In these cases, there were no defects in relation to connection between the external electrode and the lead part, but many defective products having IR degradation were found, and thus, it could be seen that there was reliability degradation thereof due to partial permeation of the plating liquid into the product.

TABLE 3

| | w1 (mm) | W2 (mm) | L (mm) | W (mm) | w/W | # of diconnectivity | # of IR degradation [ea/100ea] |
|---|---|---|---|---|---|---|---|
| 1 | 0.040 | 0.485 | 1.0 | 0.5 | 8.2% | 9 | 0 |
| 2 | 0.045 | 0.485 | 1.0 | 0.5 | 9.3% | 5 | 0 |
| 3 | 0.053 | 0.485 | 1.0 | 0.5 | 10.9% | 0 | 0 |
| 4 | 0.055 | 0.485 | 1.0 | 0.5 | 11.3% | 0 | 0 |
| 5 | 0.140 | 0.485 | 1.0 | 0.5 | 28.9% | 0 | 0 |

TABLE 3-continued

| | w1 (mm) | W2 (mm) | L (mm) | W (mm) | w/W | # of diconnectivity | # of IR degradation [ea/100ea] |
|---|---|---|---|---|---|---|---|
| 6 | 0.170 | 0.485 | 1.0 | 0.5 | 35.1% | 0 | 0 |
| 7 | 0.200 | 0.485 | 1.0 | 0.5 | 41.2% | 0 | 0 |
| 8 | 0.230 | 0.485 | 1.0 | 0.5 | 47.4% | 0 | 0 |
| 9 | 0.260 | 0.485 | 1.0 | 0.5 | 58.6% | 0 | 0 |
| 10 | 0.290 | 0.485 | 1.0 | 0.5 | 59.8% | 0 | 0 |
| 11 | 0.320 | 0.485 | 1.0 | 0.5 | 66.0% | 0 | 0 |
| 12 | 0.350 | 0.485 | 1.0 | 0.5 | 72.2% | 0 | 0 |
| 13 | 0.380 | 0.485 | 1.0 | 0.5 | 78.4% | 0 | 0 |
| 14 | 0.410 | 0.485 | 1.0 | 0.5 | 84.5% | 0 | 0 |
| 15 | 0.420 | 0.485 | 1.0 | 0.5 | 86.6% | 0 | 4 |
| 16 | 0.430 | 0.485 | 1.0 | 0.5 | 88.7% | 0 | 7 |

<Comparison on Connectivity and IR Degradation Among Multilayer Ceramic Capacitors, According to the Ratio of Width of Lead Part to Width of External Electrode>

As shown in Table 3, a length (L) and a width (W) of the molded sheet were set to 1.0 mm and 0.5 mm respectively, and a width (W2) of the first or second external electrode 31 or 32 was set to 0.485 mm. A width (W1) of the first or second lead part 23 or 24 was variously changed. Then, the number of chips in which the first or second lead part 23 or 24 was electrically disconnected from the first or second external electrode 31 or 32, or IR was degraded, was confirmed.

Referring to Table 3, in Samples 1 and 2, which were comparative examples, a ratio of the width of the lead part to the width of the external electrode was below 10%.

In these cases, many defective products having disconnection between the lead part and the external electrode due to a relatively very small exposed area of the lead part were found, and thus, it could be seen that there was reliability degradation thereof.

In addition, in Samples 15 and 16, which were comparative examples, a ratio of the width of the lead part to the width of the external electrode was above 85%.

In these cases, there were no defects in relation to connection between the external electrode and the lead part, but many defective products having IR degradation were found, and thus, it could be seen that there was reliability degradation thereof due to partial permeation of the plating liquid into the product.

Therefore, according to Tables 1 through 3, it can be seen that, when the ratio of the width of the lead part to the width of the external electrode is 10 to 85%, the exposed area of the lead part is sufficient, thereby stably maintaining connectivity between the external electrode and the lead part, and the permeation of the plating liquid is effectively prevented, thereby suppressing degradation of the IR, resulting in products having excellent characteristics and reliability.

As shown in Table 4, a length (L) and a width (W) of the molded sheet were set to 1.0 mm and 0.5 mm respectively, and a length (a) of the first or second lead part 23 or 24 was variously changed. Then, the ESL value was checked and the number of chips having IR degradation was checked.

TABLE 4

| | Wa(mm) | L(mm) | W(mm) | # of IR degradation [ea/100 ea] | ESL [pH] |
|---|---|---|---|---|---|
| 1 | 0.020 | 1.0 | 0.5 | 6 | 27.3 |
| 2 | 0.028 | 1.0 | 0.5 | 1 | 27.5 |
| 3 | 0.033 | 1.0 | 0.5 | 0 | 32.4 |
| 4 | 0.040 | 1.0 | 0.5 | 0 | 39.4 |
| 5 | 0.047 | 1.0 | 0.5 | 0 | 45.7 |
| 6 | 0.060 | 1.0 | 0.5 | 0 | 58.5 |
| 7 | 0.078 | 1.0 | 0.5 | 0 | 76.7 |
| 8 | 0.082 | 1.0 | 0.5 | 0 | 80.6 |
| 9 | 0.098 | 1.0 | 0.5 | 0 | 96.3 |
| 10 | 0.105 | 1.0 | 0.5 | 0 | 103.2 |
| 11 | 0.112 | 1.0 | 0.5 | 0 | 110.1 |

<Comparison on Properties of Multilayer Ceramic Capacitors According to the Length of Lead Part>

Referring to Table 4, in Samples 1 and 2, which were comparative examples, a length of the lead part was below 30 μm.

In these cases, many defective products having IR degradation were found, and thus, it could be seen that there was reliability degradation thereof due to permeation of the plating liquid into the product.

In Samples 10 and 11, which were comparative examples, a length of the lead part was above 100 μm.

In these cases, the degradation of IR was not found, but it could be confirmed that these samples had a severely high ESL (for example, 100 μm or higher) as compared with the other samples.

Therefore, according to Tables 4 through 6, it can be seen that, when the length of the lead part is in the range of to 100 μm, the degradation of IR is prevented and an appropriate value of ESL is maintained, resulting in products having excellent characteristics and reliability.

Hereinafter, a method of manufacturing a multilayer ceramic capacitor according to the embodiment of the present invention will be described.

A plurality of ceramic green sheets may be prepared.

The ceramic green sheet may be for forming a dielectric layer of a ceramic element 10, and maybe formed by mixing a ceramic powder, a polymer, and a solvent to prepare a slurry and molding the slurry into a sheet with a thickness of several μm through doctor blade method or the like.

Then, first and second internal electrode layers each may be formed by printing a conductive paste on at least one surface of each of the ceramic green sheets in a thickness of, for example, 0.2 to 1.0 μm.

Here, the conductive paste may be printed on the ceramic green sheet such that margin parts having a predetermined width, for example, a width of 30 to 80 μm, may be defined on a portion of the ceramic green sheet excluding the first or second internal electrode layer therefrom, respectively.

Then, first and second lead layers each may be formed by printing a conductive paste on the margin part in a frontward direction of each of the ceramic green sheets in a predetermined thickness, for example, 0.2 to 1.0 μm, in a similar manner in which the first and second internal electrode layers are formed. Here, the first and second lead layers may be formed such that they are connected to a side surface in a forward direction of the first and second ceramic green sheets.

Since the first and second lead layers have a length correspondingly to the margin part, the first and second lead layers may be controlled to have a length of 30 to 100 μm in the present embodiment.

Since the first and second internal electrode layers have different polarities, the first and second lead layers are alternately disposed such that they do not overlap along a lengthwise side of the first and second internal electrode layers when a plurality of green sheets are laminated.

In addition, specifically, the first and second lead layers may have the same width, but the present invention is not limited thereto. The widths of the first and second lead layers may be different, as necessary.

As the printing method of the conductive paste, screen printing, gravure printing, or the like may be employed. As examples of the conductive paste, a metal powder, a ceramic powder, a silica ($SiO_2$) powder, or the like, may be used.

The conductive paste may have an average particle size of 50 to 400 nm, but the present invention is not limited thereto.

Also, the metal powder may be one of nickel (Ni), manganese (Mn), chromium (Cr), cobalt (Co), and aluminum (Al), or an alloy thereof.

Then, after the plurality of ceramic green sheets having the first and second internal electrode layers and the first and second lead layers are laminated, a pressure may be applied in a lamination direction, thereby compressing the plurality of ceramic green sheets and the conductive paste formed on each of the ceramic green sheets to each other.

Therefore, there may provided a laminate in which the plurality of dielectric layers and the plurality of first and second internal electrodes 21 and 22 are alternately laminated, and the first lead part 23 and the second lead part 24 are alternately disposed along a lengthwise side of the first or second internal electrode 21 or 22.

Then, the laminate is cut into chips by cutting each region of the laminate corresponding to one capacitor, and then the chips are fired at a high temperature, thereby completing the ceramic element 10.

The first and second external electrodes 31 and 32 may then be formed to cover the ends of the first and second lead parts 23 and 24, exposed through a side surface in a forward direction of the ceramic element 10.

In other words, the first and second external electrodes 31 and 32 may be connected to the first and second lead parts 23 and 24, respectively, so that they can be electrically connected to the first and second internal electrodes 21 and 22.

In addition, the first and second external electrodes 31 and 32 may be formed to have a height corresponding to that of the ceramic element 10 so as to secure a sufficient contact area with the first and second lead parts 23 and 24 and increase the connecting property therewith.

Here, the first and the second external electrodes 31 and 32 may be formed such that a ratio of the width of the first or second lead part 23 or 24 to the width of the first or second external electrode 31 or 32 is 10 to 85%, so as to prevent degradation of the IR and have reduction of the ESL.

Also, in order to prevent degradation of the IR by improving an effect of preventing the permeation of a plating liquid, the first and second external electrodes 31 and 32 may be formed such that the first and second lead parts 23 and 24 are positioned in the middle sections of the first and second external electrodes 31 and 32 with respect to the left/right direction of the first or second internal electrode 21 or 22.

Also, as necessary, surfaces of the first and second external electrodes 31 and 32 may be plate-treated with nickel, tin, or the like.

As set forth above, according to an embodiment of the present invention, the plating liquid may be prevented from permeating into the multilayer ceramic electronic part, and have effects of preventing degradation of the IR while having low ESL characteristics, by controlling a ratio of the width of the lead part of the internal electrode to the width of the external electrode, in the multilayer ceramic electronic part.

While the present invention has been shown and described in connection with the embodiments, it will be apparent to those in the art that modifications and variations can be made without departing from the spirit and scope of the invention as defined by the appended claims.

What is claimed is:

1. A multilayer ceramic electronic part, comprising:
   a ceramic element having a plurality of dielectric layers laminated therein;
   a plurality of first and second internal electrodes each formed on at least one surface of each of the plurality of dielectric layers within the ceramic element, the first and second internal electrodes respectively including first and second lead parts extended therefrom to be exposed through a mounting surface of the ceramic element and to be disposed adjacent both end surfaces of the ceramic element in a length direction, respectively; and
   first and second external electrodes formed on one surface of the ceramic element, and electrically connected to the first and second internal electrodes through exposed portions of the first and second lead parts, respectively,
   a ratio of a width of the first or second lead part to a width of the first or second external electrode being 10 to 85%, and
   wherein the first and second external electrodes are spaced apart from the one surface of the ceramic element.

2. The multilayer ceramic electronic part of claim 1, wherein the first and second lead parts have a length of 30 to 100 μm.

3. The multilayer ceramic electronic part of claim 1, wherein the first and second internal electrodes have a thickness of 0.2 to 1.0 μm.

4. The multilayer ceramic electronic part of claim 1, wherein the first and second lead parts have a thickness of 0.2 to 1.0 μm.

5. The multilayer ceramic electronic part of claim 1, wherein the first and second lead parts are disposed alternately with each other along a lengthwise side of each of the first and second internal electrodes.

6. The multilayer ceramic electronic part of claim 1, wherein the first and second lead parts have the same width.

7. The multilayer ceramic electronic part of claim 1, wherein the first and second lead parts have different widths.

8. The multilayer ceramic electronic part of claim 1, wherein the first and second lead parts are positioned in the middle sections of the first and second external electrodes, respectively.

9. The multilayer ceramic electronic part of claim 1, wherein the first and second internal electrodes are laminated in a direction perpendicular with respect to a direction in which the first and second external electrodes are formed.

10. The multilayer ceramic electronic part of claim 1, wherein the first and second external electrodes are formed to have the same height as the ceramic element.

* * * * *